United States Patent [19]

Tumbush

[11] 3,757,298

[45] Sept. 4, 1973

[54] DECIMAL LIMIT SET FOR A BINARY DIGITAL SIGNAL COMPARISON

[75] Inventor: Gerald L. Tumbush, Xenia, Ohio

[73] Assignee: The Bendix Corporation, Southfield, Mich.

[22] Filed: Aug. 14, 1972

[21] Appl. No.: 280,400

[52] U.S. Cl. .............................. 340/146.2, 235/177

[51] Int. Cl. .............................................. G06f 7/02

[58] Field of Search ................... 235/92 CA, 92 PE, 235/177; 340/146.2

[56] References Cited

UNITED STATES PATENTS

| | | | |
|---|---|---|---|
| 3,681,582 | 8/1972 | Kimio et al. | 235/92 CA |
| 2,996,249 | 8/1961 | Wang | 235/177 |

*Primary Examiner*—Felix D. Gruber
*Assistant Examiner*—James F. Gottman
*Attorney*—William S. Thompson and John R. Benefiel

[57] ABSTRACT

An arrangement for providing an indication when the value of a varying binary digital signal is less than or greater than selectively set lower and upper decimal limits respectively. The arrangement includes a digital counter which is cyclically counted up, the contents of the counter being continuously read in binary form into a pair of one-of-eight converters, the outputs of which are in turn read into a switching matrix. The switching matrix outputs a signal state whenever the converter outputs equal either of a pair of decimal values set on a respective pair of switching matrix sliders corresponding to an upper and lower limit respectively. This signal state is used in conjunction with logic circuitry to gate the "less than" and "greater than" outputs of a comparator in which the counter contents and the varying binary digital signal are compared so that the comparator output signal is gated out to an indicator driver circuit whenever the counter contents equal either of the upper or lower limits set by the pair of switching matrix sliders. This gating is controlled by the logic circuitry so that the "less than" output is gated when the counter contents equals the set lower limit and the "greater than" output gated when the counter contents equals the set upper limit to provide an output signal whenever the varying binary digital signal either declines below the set lower limit or increases above the upper limit.

9 Claims, 3 Drawing Figures

DECIMAL LIMIT SET FOR A BINARY DIGITAL SIGNAL COMPARISON

BACKGROUND OF THE INVENTION

1. Field of the Invention

This invention concerns arrangements for providing an indication of the value of a varying binary digital signal with respect to selectively set upper and lower decimal limits.

2. Description of the Prior Art

In copending application Ser. No. 243,649, filed Apr. 13, 1972 entitled "Columnar Display for Electrical Signals with Digital Signal Limit," an arrangement for displaying the level of a variable level electrical signal is disclosed. In this application, a displacement transducer is disclosed as the signal source which generates an analog electrical signal the level of which is to be displayed by the disclosed arrangement.

As described therein, the analog electrical signal is converted into digital form in carrying out the invention. Also described therein is a limit set arragnement, in which an indication is provided for signal values which are below or above selected lower or upper limits respectively, and the comparison of this signal with these preselected values is advantageously carried out with the signal in its converted digital form.

However, both of the alternate limit systems described either have the drawback of a complex slide contact structure in the switching mechanism and/or excessively numerous lead-in connections, impose limitations on the range of upper and lower limits which can be set. Also, the decimal form of these systems imposes rather stringent response requirements on the analog to digital converter since this system requires that as the analog signal varies each incremental binary output be activated in order to trigger the limit circuit. For very rapid signal changes, this of course means the converter must respond very quickly to insure a progression of binary outputs, so that this component must be of rather expensive construction. Finally, in any such arrangement, it would be advantageous for an operator to set any such limits by means of decimal designations.

Accordingly, it is an object of the present invention to provide an arrangement for comparing a varying binary digital signal with selectively set upper and lower values without involving excessively complex slide contact structure, unduly numerous lead connections, limitations on the limit values which may be set, or unduly vigorous requirements on the analog to digital converter.

A further object is to provide such an arrangement wherein the limits may be set by means of decimal designations.

SUMMARY OF THE INVENTION

These and other objects which will become apparent upon a reading of the following specification and claims are accomplished by an arrangement utilizing a counter which is cyclically counted up and the contents of which are compared with the varying binary digital signal when coincidence is reached with preset decimal values set on a switching matrix which comparison is controlled by means of control states generated by the switching matrix and associated control logic.

DETAILED DESCRIPTION OF THE PREFERRED EMBODIMENT

In the following detailed description certain specific terminology will be utilized for the sake of clarity and a specific embodiment will be described in order to provide a complete understanding of the invention, but it is to be understood that the invention is not so limited and may be practiced in a variety of forms and embodiments.

Figure 1:
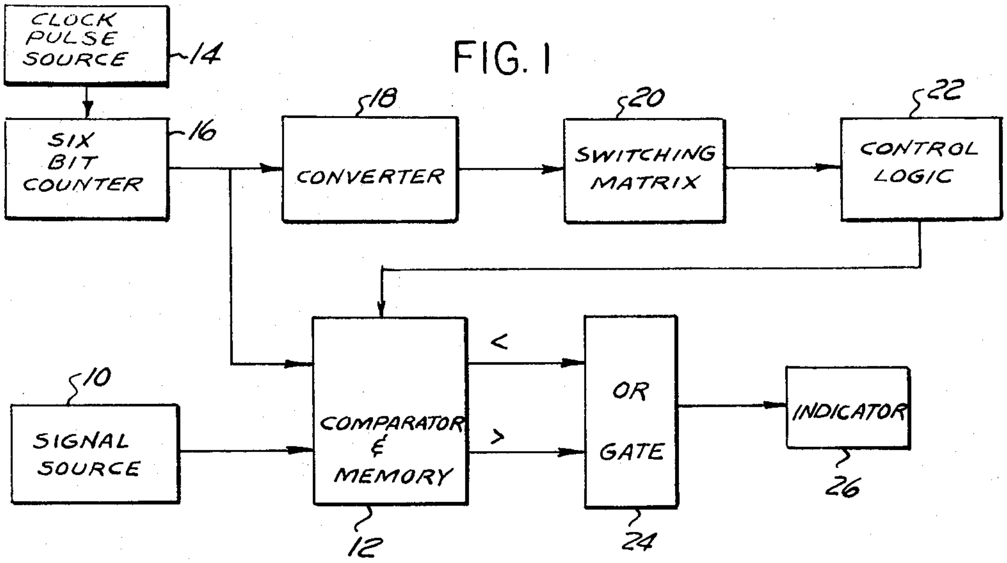
FIG. 1 is a block diagram of the arrangement according to the present invention.

Referring to the drawings and particularly FIG. 1, a binary digital signal source 10 is depicted which contains a binary signal the value of which is to be compared.

In the aforementioned copending patent application, this source takes the form of the output of an A/D converter, which receives an input analog voltage from a displacement transducer, and converts the same into a corresponding binary digital signal. The A/D converter includes a clock pulse source which cyclically counts a predetermined number of pulses into a binary counter, with the count contained therein read into a register in binary digital form when the count reaches a point corresponding to the analog signal value, to obtain the conversion. Thus, the binary digital signal source 10 would in this instance take the form of the register into which the counter contents are read.

This varying binary digital value is alternately compared in a comparator 12 with binary digital signals representing upper and lower limits selectively set by the operator.

The means for accomplishing this function includes a clock pulse source 14 coupled with a six bit binary counter 16.

Inasmuch as this combination is the same as that contemplated for use in creating the conversion of the analog signal, it can be seen that in incorporating the arrangement according to the present invention into this system, this same pulse source and counter arrangement can be advantageously used for 14 and 16 of the present system.

The count contained in the counter 16 is decoded in a converter 18 by a pair of one-of-eight converters to be described herein, and thence read into a switching matrix 20 also to be described in detail herein.

The switching matrix 20 is adapted to produce a logic state output signal whenever the decoded value read out of the counter 16 coincides with either the high or low limit preset by the operator coincides.

This logic state signal is combined with other information in a control logic circuit 22 to produce control signals which are transmitted to the comparator 12 to control the output from the comparator 12. This other information is that necessary for proper synchronous operation of the system as may be required for a given particular application. A typical example is found in the use of this system in the context described above, as the binary digital signal in the register is periodically updated and a comparison cannot of course be carried out during this updating, and hence a signal will be generated indicating a "signal ready" condition.

A pair of control signals are alternately generated by the control logic 22 upon occurrence of the signal state output of the switching matrix, one corresponding to the lower limit coincidence and the other to the upper limit coincidence and each applied to the comparator 12, the one signal state calling for an output of the "less than" and the other signal state for the "greater than" output of the comparator 12.

This arrangement thus alternately gates out the signal state resulting from a comparison of the varying binary digital signal with the counter contents at the times that its contents equal the lower and upper limits set in the switching matrix 20.

The comparator outputs are combined in an OR gate 24 which outputs a signal to an indicator arrangement 26 if either the "less than" or "greater than" condition occurs during this comparison, to provide an indication thereof.

Figure 2:
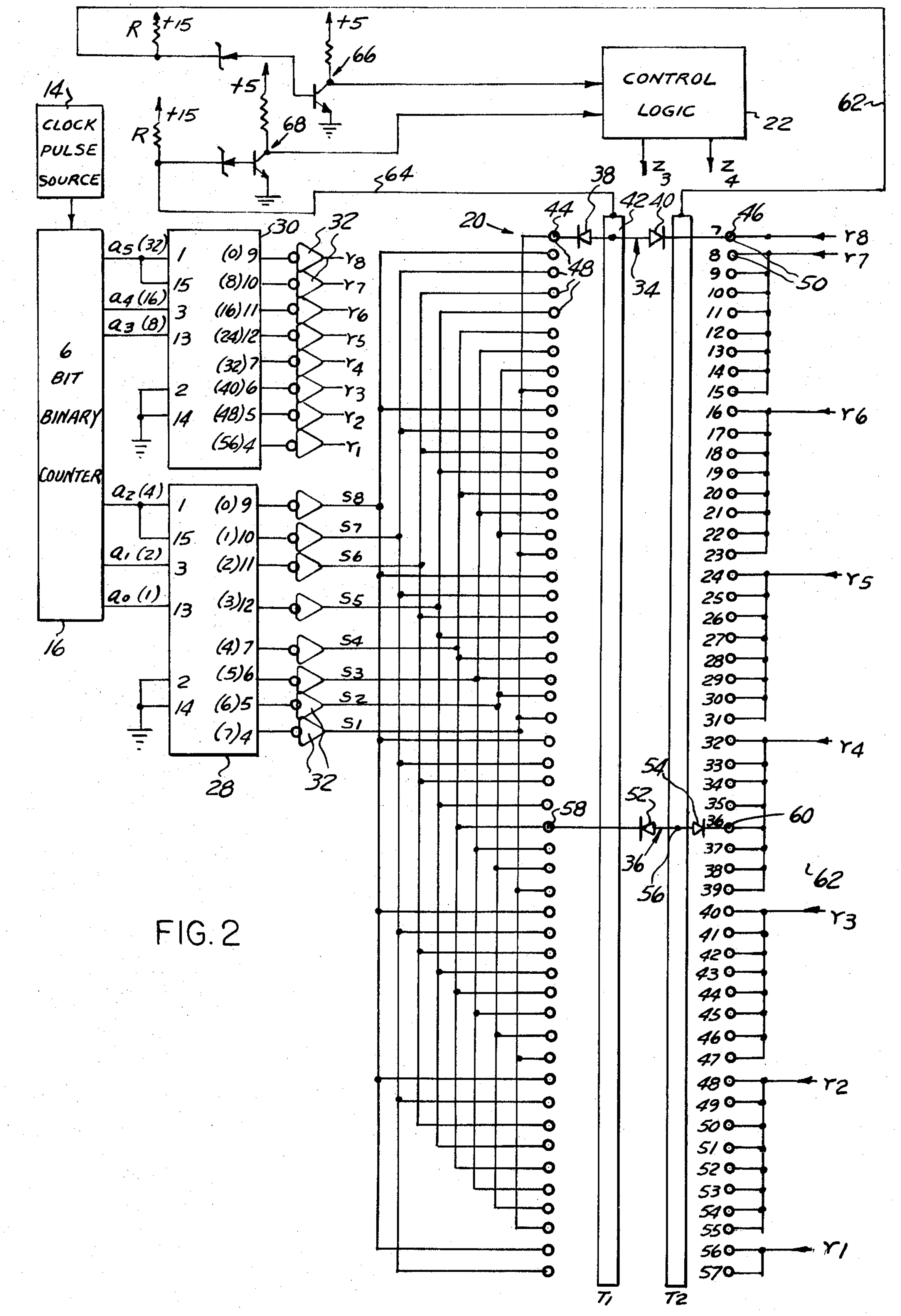
FIG. 2 is a schematic representation of decoding and switching portions of the arrangement shown in FIG. 1.

Referring to FIG. 2, the details of the converter 18 and switching matrix 20 are shown.

The converter 18 includes a pair of "octal" or "one-of-eight" converter means 28 and 30. The converter 28 receives the lower three successive orders of the binary number $a_0$, $a_1$, $a_2$ from the counter 16 and converts the same into "low" logic level output signals at outputs $S_1 - S_8$, an output signal at each output corresponding to an input binary number represented by the three successive orders $a_0$, $a_1$, $a_2$. That is, for a binary 000, the output $S_8$ goes to a low state to provide an output signal, while all other outputs remain "high," while for binary number 001, output $S_7$ goes to a low state to provide low signal and all the others remain high and so on.

Similarly, octal converter means 30 receives the three higher successive orders of the binary number $a_3$, $a_4$, and $a_5$, and outputs a low logic level output signal on a respective output $R_1 - R_8$, each of these outputs corresponding to an inputed binary number represented by the three higher successive orders $a_3$, $a_4$, and $a_5$. That is, for binary 000, the $R_8$ output goes low while all other outputs remain "high." For binary 001, the $R_7$ output goes "low" to provide an output signal and all the other outputs are "high" and so on.

Inasmuch as suitable octal converters are well known and commercially available in themselves, the details thereof are not here included.

Each of the outputs of octal converter means 28 and 30 are connected to an inverter 32, so that output "lows" are inverted to "highs" on the "S" and "R" outputs connected to the switching matrix 20.

The switching matrix 20 includes a pair of conductive tracks $T_1$ and $T_2$, each having an associated first and second movable slider contact means 34 and 36 respectively.

First movable slider contact means 34 includes a pair of diodes 38 and 40 having their anodes connected together with a central slidable contact 42 conductively engaging the track $T_1$. Also included are a pair of slidable contacts 44 and 46 which are respectively connected to the cathodes of diodes 38 and 40 and which are adapted to successively engage one each of a pair of opposing linear series of contacts 48 and 50 respectively depending on the selected position of the slider 34 on the conductive strip $T_1$ to connect opposing contacts in each series.

Contacts 48 are connected to the "S" outputs from converter 28 while contacts 50 are connected to "R" outputs from converter 30 in the pattern shown in FIG. 2.

Second movable slider contact means 36 likewise includes a pair of diodes 52 and 54 having their anodes connected together with a slidable contact 56 conductively engaging conductive track $T_2$, and also including a pair of slidable contacts 58 and 60 connected to the cathodes of diodes 52 and 54 and which are adapted to engage one of each linear series of contacts 48 and 50 respectively to connect opposing contacts in each series.

Each central slidable contact 42 and 56 is connected to a source of anode voltage (+15) via lines 62 and 64 and conductive tracks $T_1$ and $T_2$ respectively and resistors R to form a diode AND gate at each slider 34 and 36. That is, if either contact in the linear series of contacts 48 and 50 connected by a slider 34 or 36 is "low" (grounded) the associated diode conducts, reducing the potential at the central contact and connected line 62 or 64 to ground or zero. If both are high, both diodes are cut off and the potential at the central contact and connected line 62 or 64 is high.

Thus, at each position of the first and second movable slider contact means 34 and 36, both the S and R outputs connected must be "high" in order to obtain a high output on lines 62 or 64. Thus, this arrangement provides a slider output means producing an output signal whenever both of the octal converter means outputs connected by the first or second movable slider contact means and the contact series 48 and 50 is present.

The R and S outputs of converter means 28 and 30 are connected so that for each successive position of the movable slider means 34 and 36, both the R and S outputs connected thereby will have an output signal for only a single successive binary valve represented by the inputs $a_0 - a_5$, so that consecutive decimal values can be assigned to each potential position of a slider. In this arrangement, successive groupings of the contacts 50 in one of the series of contacts are connected to a single output of the octal converter means 30 which receives the higher three orders $a_3$, $a_4$ and $a_5$ of the binary digital signal, with contacts 48 in the other series opposite the various groupings of contacts 50 connected to successive S outputs of the octal converter means 28 which receives the lower three orders $a_0$, $a_1$ and $a_2$ of the binary digital signal.

As described in the aforementioned copending application, while six binary orders can represent 0–63 decimal values, a normal range of +25 to −25 is adequate for the system described therein, and thus for this application connections are made only for the R and S outputs corresponding to decimal 7 through 57 as indicated in FIG. 2.

Accordingly, as the counter 16 is counted up, the count will first reach coincidence with the corresponding decimal set on first movable slider contact means 34 causing line 64 to go "high" and then reach coincidence with the corresponding decimal set on slider 36 causing line 62 to go "high."

These states are inverted by transistor NOT's (inverters) 66 and 68 and input to the control logic via lines 70 and 72 for further processing with other information necessary for synchronous operation of the system as described above to produce a pair of control signal states $Z_3$ and $Z_4$ each occurring with coincidence of the counter contents with the decimal value set on the first and second slider contact means 34 and 36 respectively.

Figure 3:
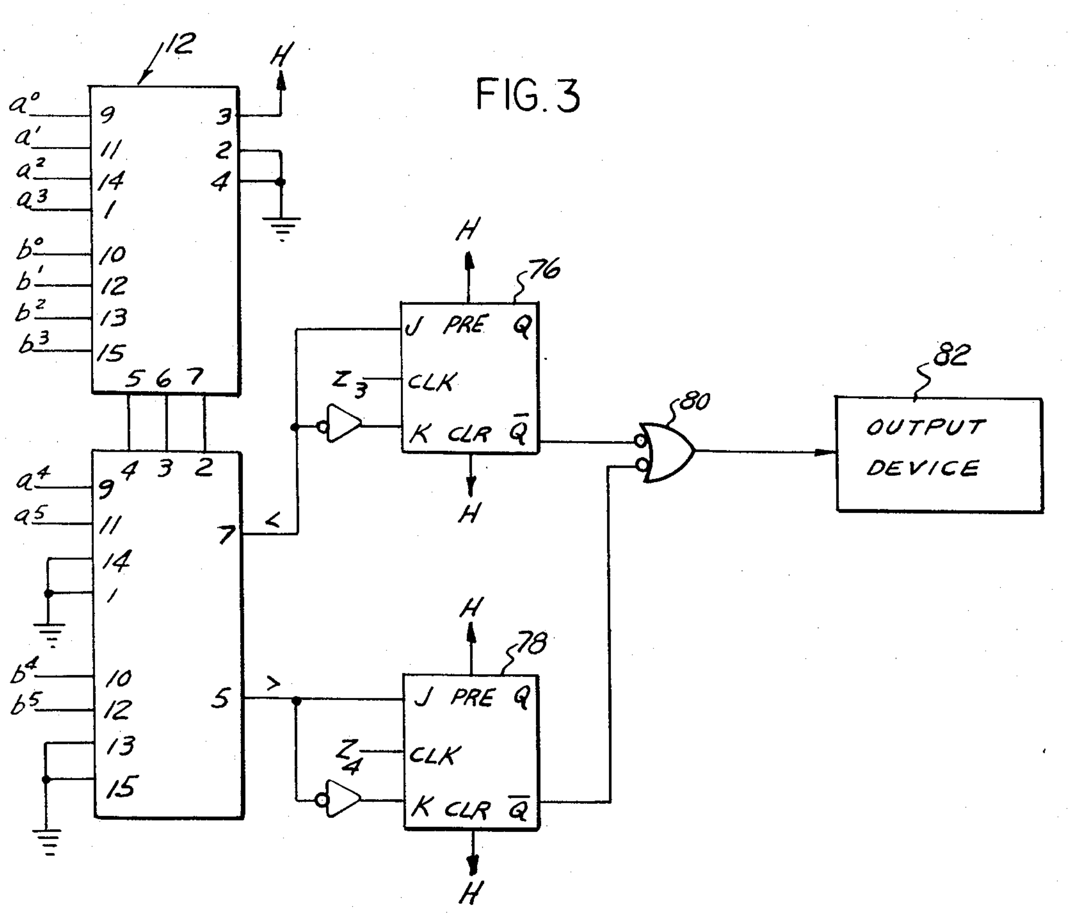
FIG. 3 is a schematic representation of the comparator and indicator portions of the arrangement shown in FIG. 1.

Referring to FIG. 3, it can be seen that the $Z_3$ and $Z_4$ control signal states are used to control the outputs of the six bit comparator 12 by means of a pair of flip-flops 76 and 78.

The "less than" output is connected to the flip-flop 76 as shown which is steered by $Z_3$ so that the results of the "less than" comparison between the counter contents and the varying binary signal are read out on the $\overline{Q}$ output when the counter contents equals the decimal value set by the slider 34. Accordingly, if the varying binary signal value is less than the counter contents a low state signal is created on the $\overline{Q}$ output indicative thereof.

The "greater than" output is connected to the flip-flop 78 so that a low logic state is created on the $\overline{Q}$ output if the varying binary signal is greater than the counter contents when coincidence is reached with the decimal value set by the second movable slider contact means 36.

These outputs are combined in NAND gate 80 and used to drive an output device 82 to provide an output signal whenever the varying binary signal is outside the range defined by the upper and lower limits set by the first and second movable slider contact means 34 and 36.

It can be appreciated by this description that a relatively simple contact structure is provided by this arrangement, and in addition, the upper and lower limits can be set anywhere in the range +25 to −25, and as the binary digital signal does not have to pass through the specific limit values set to trigger the limit indicator, the A/D converter need not be of a rapid response type.

In addition, it should also be appreciated that while the specific embodiment described provides an upper and lower limit set, the invention can also be utilized to set a single lower or upper limit by including only a single slide $T_1$ or $T_2$ and slider contact means, modifying the control logic to respond to a single control state, and gating out only the "greater than" or "less than" output from the comparator as required for the particular application.

Many other variations are of course possible within the scope of the following claims:

I claim:

1. An arrangement for producing an output signal when a binary digital signal equals a selectively set corresponding decimal value comprising:

at least two octal converter means, each receiving three successive orders of said varying binary digital signal and each outputting an output signal on one of eight outputs for each binary digital signal represented by said three successive orders of said binary digital signal;

at least two series of contacts, each of said contacts in each of said series connected to an output of a respective octal converter means associated with each series of contacts;

slider contact means selectively movable to successively connect contacts of one series of said at least two series of contacts to contacts in another of said at least two series of contacts;

slider output means operatively associated with said slider contact means producing an output signal whenever both of said output signals of said respective octal converter means outputs connected by said movable slider contact means and said series of contacts are present, whereby said slider output means signal provides an indication when said binary digital signal equals a value corresponding to a single decimal value.

2. The arrangement of claim 1 wherein said contact series are disposed opposite each other and are connected to the outputs of said octal converter means so that successive positions of said slider contact means connecting said contacts correspond to successive decimal values, in which arrangement successive groupings of the contacts of one of said at least two series are each connected to a single output of one of said octal converter means which receives the higher orders of said binary digital signal and in which the opposing contacts in another of said at least two series of contacts are connected to successive outputs of another octal converter means which receives a lower three successive orders of said binary digital signal than that received by said one of said octal converter means.

3. The arrangement of claim 1 further including a second slider contact means selectively movable to successively connect contacts of one series of said at least two series of contacts to contacts in another series of said at least two series of contacts and a second slider output means operatively associated with said second slider contact means producing an output signal whenever both of said output signals of said respective octal converter means outputs connected by said movable slider contact means and said series of contacts are present, whereby said second slider output means signal provides an indication when said binary digital signal equals a value corresponding to a single second decimal value.

4. The arrangement of claim 1 wherein said at least two series of contacts comprises a pair of linearly disposed opposed contact series, and wherein said slider contact means connects opposed contacts of said pair of contact series.

5. An arrangement for comparing a varying binary digital signal with a selectively set decimal value comprising:

a pulse source;

counter means providing a cyclical binary digital count up of pulses received from said pulse source;

means for producing an output signal when said binary digital signal count reaches a selectively set corresponding decimal value including:

at least two octal converter means, each receiving three successive orders of said varying binary digital signal and each outputting an output signal on one of eight outputs for each binary digital signal represented by said three successive orders of said binary digital signal;

at least two series of contacts, each of said contacts in each of said series connected to an output of a respective octal converter means associated with each series of contacts;

slider contact means selectively movable to successively connect contacts of one series of said at least two series of contacts to contacts in another series of said at least two series of contacts;

slider output means operatively associated with said slider contact means producing an output signal whenever both of said output signals of said respective octal converter means outputs connected by said movable slider contact means and said series of contacts are present;

comparator means receiving said varying binary digital signal and said binary digital count and comparing said signal and said count whenever said slider output means produces said output signal and providing a comparator output signal indicative of the results of said comparison, whereby said varying binary digital signal is compared with said selectively set corresponding decimal value.

6. The arrangement of claim 5 wherein said at least two contact series are disposed opposite each other and are connected to the outputs of said octal converter means so that successive positions of said slider contact means connecting said contacts corresponds to successive decimal values, in which successive groupings of the contacts of one of said at least two series are each connected to a single output of one of said octal converter means which receives the higher orders of said binary digital signal and in which the opposing contacts in another of said at least two series of contacts are connected to successive outputs of another octal converter means which receives a lower three successive orders of said binary digital signal than that received by said one of said octal converter means.

7. The arrangement of claim 5 further including a second slider contact means selectively movable to successively connect contacts of one series of said at least two series of contacts to contacts in another series of said at least two series of contacts and a second slider output means operatively associated with said second slider contact means producing an output signal whenever both of said output signals of said respective octal converter means outputs connected by said movable contact series are present, and wherein said comparator means compares said count and said signal whenever either of said slider output means produces an output signal.

8. The arrangement of claim 7 wherein said comparator means includes means producing an output signal whenever said binary digital signal is higher than said count corresponding to the higher decimal value set of said slider contact means and also includes means producing an output signal whenever said binary digital signal is less than said count corresponding to the decimal value set by the other of said slider contact means, whereby an output signal is produced whenever said binary digital signal value goes outside the range defined by said set decimal values.

9. The arrangement of claim 5 wherein said at least two contact series comprises a pair of opposed, linearly disposed series of contacts, and wherein said slider contact means connects opposed contacts of said pair of contact series.

* * * * *